(12) United States Patent
Balakrishnan et al.

(10) Patent No.: US 9,716,145 B2
(45) Date of Patent: Jul. 25, 2017

(54) STRAINED STACKED NANOWIRE FIELD-EFFECT TRANSISTORS (FETS)

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/851,584

(22) Filed: Sep. 11, 2015

(65) Prior Publication Data
US 2017/0077232 A1    Mar. 16, 2017

(51) Int. Cl.
*H01L 27/12* (2006.01)
*H01L 29/06* (2006.01)
(Continued)

(52) U.S. Cl.
CPC ...... *H01L 29/1054* (2013.01); *H01L 29/0673* (2013.01); *H01L 29/42392* (2013.01);
(Continued)

(58) Field of Classification Search
CPC ........... H01L 21/02532; H01L 21/2652; H01L 21/823412; H01L 21/22; H01L 21/225;
(Continued)

(56) References Cited

U.S. PATENT DOCUMENTS 5,757,038 A * 5/1998 Tiwari ............... B82Y 10/00
257/192
7,728,324 B2 * 6/2010 Tezuka ............ H01L 21/823807
257/20
(Continued)

OTHER PUBLICATIONS

W.W. Fang et al., "Vertically Stacked SiGe Nanowire Array Channel CMOS Transistors," IEEE Electron Device Letters, Mar. 2007, pp. 211-213, vol. 28, No. 3.
(Continued)

*Primary Examiner* — Natalia Gondarenko
(74) *Attorney, Agent, or Firm* — Louis J. Percello; Ryan, Mason & Lewis, LLP

(57) ABSTRACT

A method for manufacturing a semiconductor device comprises epitaxially growing a plurality of silicon layers and compressively strained silicon germanium (SiGe) layers on a substrate in a stacked configuration, wherein the silicon layers and compressively strained SiGe layers are alternately stacked on each other starting with a silicon layer on a bottom of the stacked configuration, patterning the stacked configuration to a first width, selectively removing a portion of each of the silicon layers in the stacked configuration to reduce the silicon layers to a second width less than the first width, forming an oxide layer on the compressively strained SiGe layers of the stacked configuration, wherein forming the oxide layer comprises fully oxidizing the silicon layers so that portions of the oxide layer are formed in place of each fully oxidized silicon layer, and removing part of the oxide layer while maintaining at least part of the portions of the oxide layer formed in place of each fully oxidized silicon layer, wherein the compressively strained SiGe layers are anchored to one another and a compressive strain is maintained in each of the compressively strained SiGe layers.

15 Claims, 7 Drawing Sheets

(51) Int. Cl.
*H01L 29/10* (2006.01)
*H01L 29/423* (2006.01)
*H01L 29/786* (2006.01)
*H01L 29/66* (2006.01)
*H01L 21/02* (2006.01)
*H01L 21/324* (2006.01)

(52) U.S. Cl.
CPC .. *H01L 29/66742* (2013.01); *H01L 29/78684* (2013.01); *H01L 29/78696* (2013.01)

(58) Field of Classification Search
CPC ............. H01L 21/2256; H01L 21/2253; H01L 21/28176; H01L 21/2855; H01L 21/31056; H01L 21/32105; H01L 21/28518; H01L 21/2818; H01L 21/8232; H01L 21/823807; H01L 21/8234; H01L 21/8238; H01L 21/823821; H01L 21/823814; H01L 21/84; H01L 29/0878; H01L 29/66; H01L 29/66636; H01L 29/6659; H01L 29/66795; H01L 29/66477; H01L 29/78618; H01L 29/78; H01L 29/785; H01L 29/0665; H01L 29/0669; H01L 29/66818; H01L 21/265; H01L 21/02603; H01L 21/30604; H01L 21/76283; H01L 21/0245; H01L 21/02359; H01L 21/02381; H01L 21/02164; H01L 21/02236; H01L 29/0676; H01L 29/1054; H01L 29/775; H01L 29/66666; H01L 29/66439; H01L 29/78696; H01L 29/42392; H01L 29/66742; H01L 29/7848; H01L 29/7842; H01L 29/7847; H01L 29/7849; H01L 29/78684; H01L 29/161; H01L 29/1037; H01L 29/0847; H01L 27/1211; H01L 27/0924; H01L 27/0886; H01L 29/068; H01L 29/0673; H01L 29/165; H01L 29/42324; H01L 21/02507; H01L 21/02255; H01L 21/02233; H01L 21/02554; H01L 21/31658; H01L 21/324; H01L 21/845
USPC ........ 438/689, 285; 257/347, 192, 288, 616, 257/E29.255, E21.409
See application file for complete search history.

(56) References Cited

U.S. PATENT DOCUMENTS

| | | | |
|---|---|---|---|
| 7,821,061 B2* | 10/2010 | Jin | B82Y 10/00 257/19 |
| 9,484,406 B1* | 11/2016 | Sun | H01L 29/413 |
| 2007/0148939 A1* | 6/2007 | Chu | H01L 21/823807 438/590 |
| 2008/0135949 A1* | 6/2008 | Lo | B82Y 10/00 257/401 |
| 2009/0090934 A1* | 4/2009 | Tezuka | H01L 27/1211 257/190 |
| 2010/0187503 A1* | 7/2010 | Moriyama | B82Y 10/00 257/24 |
| 2011/0070734 A1* | 3/2011 | Saracco | B82Y 10/00 438/689 |
| 2014/0138770 A1* | 5/2014 | van Dal | H01L 29/66431 257/347 |
| 2015/0053928 A1* | 2/2015 | Ching | H01L 21/823821 257/29 |
| 2015/0372119 A1* | 12/2015 | Zhang | B82Y 10/00 438/268 |
| 2016/0268312 A1* | 9/2016 | Wang | H01L 27/1211 |

OTHER PUBLICATIONS

A. Hubert et al., "A Stacked SONOS Technology, Up to 4 Levels and 6nm Crystalline Nanowires, With Gate-All-Around or Independent Gates (Φ-Flash), Suitable for Full 3D Integration," IEEE International Electron Devices Meeting (IEDM), Dec. 2009, pp. 637-640.

M. Najmzadeh et al., "Silicon Nanowires With Lateral Uniaxial Tensile Stress Profiles for High Electron Mobility Gate-All-Around MOSFETs," 35th International Conference on Micro- and Nano-Engineering, Microelectronic Engineering, May-Aug. 2010, pp. 1561-1565, vol. 87, Nos. 5-8.

R.M.Y. Ng et al., "Vertically Stacked Silicon Nanowire Transistors Fabricated by Inductive Plasma Etching and Stress-Limited Oxidation," IEEE Electron Device Letters, Mar. 2009, pp. 520-522, vol. 30, No. 5.

* cited by examiner

STRAINED STACKED NANOWIRE FIELD-EFFECT TRANSISTORS (FETS)

TECHNICAL FIELD

The field generally relates to semiconductor devices including stacked nanowires and methods of manufacturing same and, in particular, to semiconductor devices including compressively strained stacked nanowires.

BACKGROUND

A nanowire is a relatively thin wire, for example, with a diameter or width measured in nanometers (nm). Nanowires can have diameters or widths such as, for example, about 4 nm to 10 nm.

Nanowires can be a viable device option instead of fin field-effect transistors (FinFETs). For example, a nanowire can be used as the fin structure in a dual-gate, tri-gate or gate-all-around (GAA) FET device. Nanowires can have a smaller perimeter than fins, but also larger external resistance due to an under-spacer component.

Complementary metal-oxide semiconductor (CMOS) scaling can be enabled by the use of stacked nanowires, which offer superior electrostatics and higher current density per footprint area than FinFETs.

Techniques for manufacturing nanowire devices can include suspension and deposition. A challenge with nanowires is how to improve nanowire device performance, particularly for p-type FETs (PFETs). Known techniques for manufacturing nanowire devices do not maintain strain in nanowires. Loss in strain causes mobility degradation, resulting in lower performance.

SUMMARY

According to an exemplary embodiment of the present invention, a method for manufacturing a semiconductor device comprises epitaxially growing a plurality of silicon layers and compressively strained silicon germanium (SiGe) layers on a substrate in a stacked configuration, wherein the silicon layers and compressively strained SiGe layers are alternately stacked on each other starting with a silicon layer on a bottom of the stacked configuration, patterning the stacked configuration to a first width, selectively removing a portion of each of the silicon layers in the stacked configuration to reduce the silicon layers to a second width less than the first width, performing a condensation process, wherein the silicon layers are fully oxidized during the condensation process, and the condensation process results in an oxide layer on the substrate and on remaining portions of the stacked configuration, the oxide layer including portions formed in place of each fully oxidized silicon layer maintaining a compressive strain in each of the compressively strained SiGe layers, and removing part of the oxide layer, wherein remaining portions of the oxide layer are in the stacked configuration and have a smaller width than a width of the compressively strained SiGe layers, the remaining portions of the oxide layer maintaining the compressive strain in each of the compressively strained SiGe layers.

According to an exemplary embodiment of the present invention, a semiconductor device comprises a substrate, a plurality of compressively strained silicon germanium (SiGe) nanowires on the substrate in a stacked configuration, wherein the stacked configuration includes respective dielectric layers alternately stacked on the SiGe nanowires and forming a plurality of anchors, and a gate structure formed on the stacked configuration.

According to an exemplary embodiment of the present invention, a method for manufacturing a semiconductor device comprises epitaxially growing a plurality of silicon layers and compressively strained silicon germanium (SiGe) layers on a substrate in a stacked configuration, wherein the silicon layers and compressively strained SiGe layers are alternately stacked on each other starting with a silicon layer on a bottom of the stacked configuration, patterning the stacked configuration to a first width, selectively removing a portion of each of the silicon layers in the stacked configuration to reduce the silicon layers to a second width less than the first width, forming an oxide layer on the compressively strained SiGe layers of the stacked configuration, wherein forming the oxide layer comprises fully oxidizing the silicon layers so that portions of the oxide layer are formed in place of each fully oxidized silicon layer, and removing part of the oxide layer while maintaining at least part of the portions of the oxide layer formed in place of each fully oxidized silicon layer, wherein the compressively strained SiGe layers are anchored to one another and a compressive strain is maintained in each of the compressively strained SiGe layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Figure 1A:
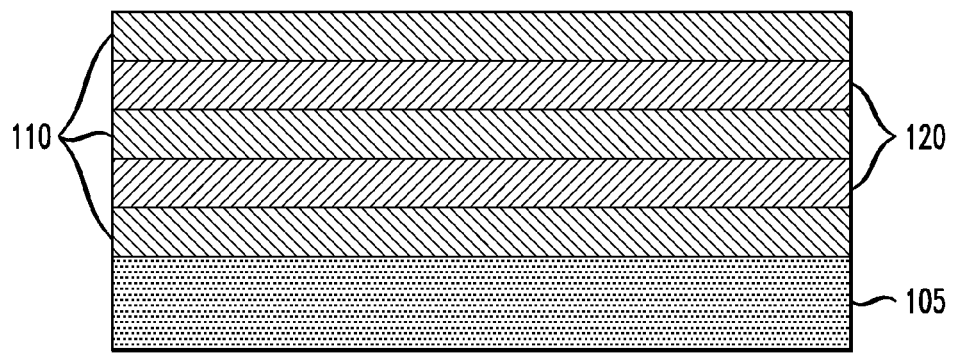
FIG. 1A is a cross-sectional view of a semiconductor substrate taken parallel to a gate extension direction and illustrating epitaxial growth of a relaxed silicon and compressively strained silicon germanium (SiGe) stack, according to an exemplary embodiment of the present invention.

Exemplary embodiments of the invention will now be discussed in further detail with regard to semiconductor devices including stacked nanowire FETS and methods of manufacturing same and, in particular, to stacked nanowire CMOS devices that preserve strain in the nanowires.

It is to be understood that the various layers and/or regions shown in the accompanying drawings are not drawn to scale, and that one or more layers and/or regions of a type commonly used in CMOS, fin field-effect transistor (FinFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The stacked nanowire FET devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the stacked nanowire FET devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require stacked nanowire FETs. By way of non-limiting example, the semiconductor devices can include, but are not limited to, CMOS devices, MOSFET devices, FinFET devices, and/or semiconductor devices that do not use FinFET technology.

As used herein, with reference to the drawings, "parallel to a gate extension direction" refers to an extension direction of a gate structure perpendicular to a channel length and to the left and right in these cross-sections, with source/drain regions in front and behind the nanowires in these cross-sections. In other words, left and right in these cross-sections represents a width or diameter direction of the nanowire, and the length of the nanowire and a channel length are going into the page.

As used herein, with reference to the drawings, "perpendicular to a gate extension direction" or "across a channel of a gate structure" refers to a channel length direction of a gate structure and source/drain regions being to the left and right of the nanowires in these cross-sections. In other words, left and right in these cross-sections represents a length direction of the nanowire, and the width or diameter of the nanowire and extension direction of the gate structure are going into the page.

As used herein, "height" refers to a vertical length of an element (e.g., a layer, etc.) in the figures measured from a bottom surface to a top surface of the element, and/or measured with respect to a surface on which the element is directly on.

As used herein, "lateral," "lateral side," "lateral surface" refers to a side surface of an element (e.g., a layer, etc.), such as a left or right side surface in the figures.

The processes described in connection with FIGS. 1A-B to 6A-B is applicable to the manufacture of p-type FET (PFET) devices including SiGe channels, which benefit from maintaining compressive strain. Conventional methods of fabricating PFET stacked nanowire devices including SiGe channels involves suspending the channel regions before forming a gate-all-around structure. Suspending the nanowires relaxes the compressive strain which was created during the epitaxial SiGe growth, and therefore negatively affects device performance. Known techniques for the manufacture of stacked nanowire n-type FETs (NFETS) can be used in conjunction with the processes described in connection with FIGS. 1A-B to 6A-B to yield similar short channel effects between resulting PFET and NFET devices. Short channel effects between the resulting PFET and NFET devices will not be identical due to differences between gate structures in resulting NFET and PFET devices. A process for the manufacture of an NFET device including silicon channels, according to an embodiment of the present invention, is described in connection with FIGS. 8-14.

Figure 1B:
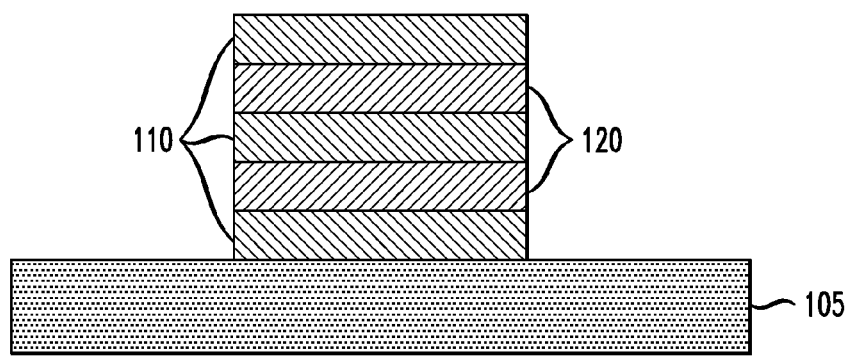
FIG. 1B is a cross-sectional view of a semiconductor substrate taken perpendicular to a gate extension direction (e.g. across a channel of the gate structure) and illustrating epitaxial growth of a relaxed silicon and compressively strained SiGe stack, according to an exemplary embodiment of the present invention.

FIGS. 1A and 1B are cross-sectional views of a semiconductor substrate respectively taken parallel and perpendicular to a gate extension direction and illustrating epitaxial growth of a relaxed silicon and compressively strained SiGe stack, according to an exemplary embodiment of the present invention. A semiconductor substrate 105 can be, for example, a bulk substrate or a silicon-on-insulator (SOI) substrate including a buried insulating layer, such as, for example, a buried oxide or nitride layer located on an upper surface of the semiconductor substrate. The substrate 105 may comprise semiconductor material including, but not limited to, Si, SiGe, SiC, SiGeC, III-V, II-V compound semiconductor or other like semiconductor. In addition, multiple layers of the semiconductor materials can be used as the semiconductor material of the substrate. In accordance with an embodiment of the present invention, as can be seen in FIG. 1, relaxed silicon layers 110 and compressively strained SiGe layers 120 are epitaxially grown in an alternating and stacked configuration, so that a first silicon layer 110 is followed a first SiGe layer 120 on the first silicon layer, which is followed by a second silicon layer 110 on the first SiGe layer 120, and so on. While three silicon layers 110 and two SiGe layers 120 are shown, the embodiments of the present invention are not necessarily limited to the shown number of layers 110, 120, and there may be more or less layers in the same alternating configuration depending on design constraints.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the relaxed silicon and compressively strained SiGe layers 110, 120. In some embodiments, a gas source for the deposition of epitaxial semiconductor material includes a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In accordance with an embodiment of the present invention, the epitaxial growth is performed by growing layers, each of which has a height (in the vertical direction in the figures) of between approximately 5 nm and approximately 20 nm. According to an embodiment, approximately between 3 and 5 pairs of layers 110, 120 are formed. The alternating structure may be formed by in-situ epitaxy of layers 110 and 120 in a rapid thermal chemical vapor deposition (RTCVD) chamber, and by controlling the gas flow, pressure, and temperature in the chamber, as well as the duration of the in-situ epitaxy.

Figure 2A:
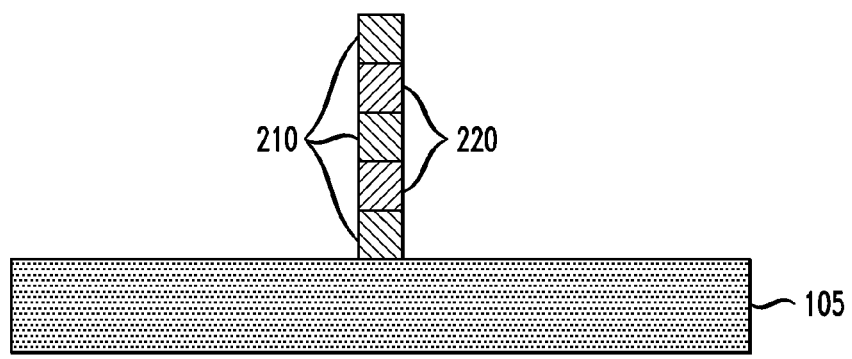
FIG. 2A is a cross-sectional view of a semiconductor substrate taken parallel to a gate extension direction and illustrating patterning of the relaxed silicon and compressively strained SiGe stack, according to an exemplary embodiment of the present invention.
Figure 2B:
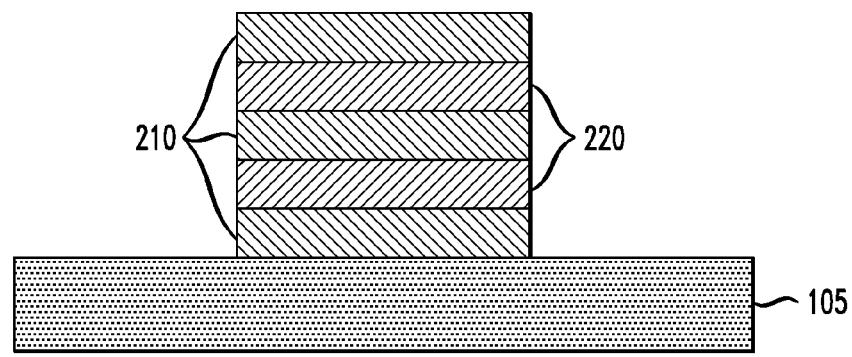
FIG. 2B is a cross-sectional view of a semiconductor substrate taken perpendicular to a gate extension direction and illustrating patterning of the relaxed silicon and compressively strained SiGe stack, according to an exemplary embodiment of the present invention.

FIGS. 2A and 2B are cross-sectional views of a semiconductor substrate respectively taken parallel and perpendicular to a gate extension direction and illustrating patterning of the silicon and SiGe stack, according to an exemplary embodiment of the present invention. Patterning is performed by, for example, etching, such as, for example, an isotropic etching process, such as reactive ion etching (RIE).

As can be seen in FIGS. 2A and 2B, the patterning decreases a width of the silicon and SiGe layers 110 and 120 along an extension direction of a gate structure, and maintains a length along a channel length direction to result in patterned silicon and SiGe layers 210 and 220. The resulting width of silicon and SiGe layers 210 and 220 is about 4 nm to about 20 nm.

The etching is performed using a reactive ion etch (RIE) process and a mask including, for example, a nitride, oxide, or an organic resist, covering what is to be a remaining portion of silicon and SiGe layers.

Figure 3A:
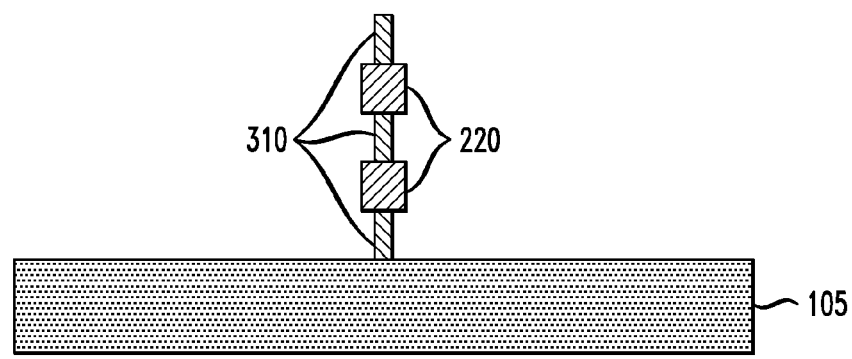
FIG. 3A is a cross-sectional view of a semiconductor substrate taken parallel to a gate extension direction and illustrating selective removal of part of the relaxed silicon layers from the relaxed silicon and compressively strained SiGe stack, according to an exemplary embodiment of the present invention.
Figure 3B:
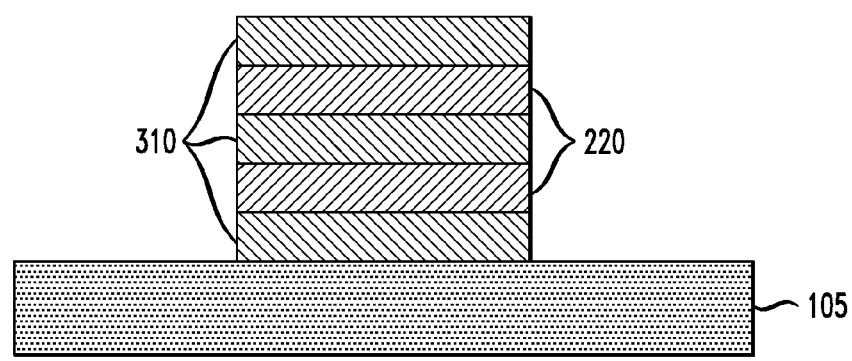
FIG. 3B is a cross-sectional view of a semiconductor substrate taken perpendicular to a gate extension direction and illustrating selective removal of part of the relaxed silicon layers from the silicon and compressively strained SiGe stack, according to an exemplary embodiment of the present invention.

FIGS. 3A and 3B are cross-sectional views of a semiconductor substrate respectively taken parallel and perpendicular to a gate extension direction and illustrating selective removal of part of the silicon layers from the silicon and SiGe stack, according to an exemplary embodiment of the present invention. Referring to FIGS. 3A and 3B, selective removal of part of the silicon layers 210 is performed, leaving further patterned silicon layers 310 to preserve anchoring of SiGe layers 220, and, thereby maintain compressive strain on the SiGe layers 220. A relaxed unstrained state of SiGe degrades performance of a PFET, which can benefit from compressive strain.

In accordance with an embodiment of the present invention, the selective removal of part of the silicon layers 210 is performed with respect to the SiGe layers 220, and is performed by etching, such as a wet etch, using, for example, tetramethylammonium-hydroxide (TMAH). Other etchants may include, for example, plasma etchants: $CF_4$, $SF_6$, $NF_3$, $Cl_2$, $CCl_2F_2$, and wet etchants: hydrochloric acid (HCl), and a mixture of nitric and hydrochloric acid. According to an embodiment, the removal of part of the silicon layers 210 is performed without removing the SiGe layers 220.

As can be seen in FIGS. 3A and 3B, the patterning decreases a width of the silicon layers 210 along an extension direction of a gate structure, and maintains a length along a channel length direction to result in patterned silicon layers 310. The resulting width of silicon layers 310 is about 2 nm to about 4 nm.

Figure 4A:
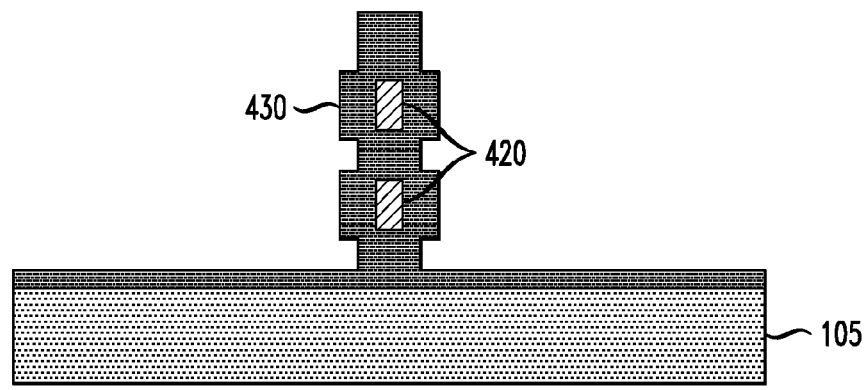
FIG. 4A is a cross-sectional view of a semiconductor substrate taken parallel to a gate extension direction and illustrating thermal condensation performed in a process after formation of the structure from FIGS. 3A and 3B, according to an exemplary embodiment of the present invention.
Figure 4B:
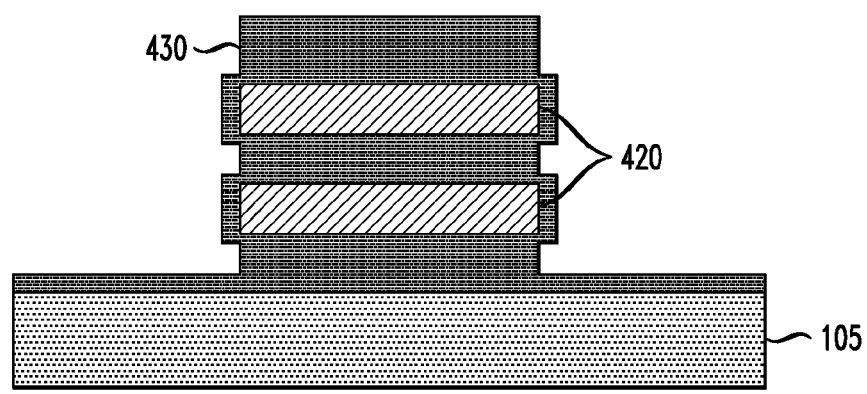
FIG. 4B is a cross-sectional view of a semiconductor substrate taken perpendicular to a gate extension direction and illustrating thermal condensation performed in a process after formation of the structure from FIGS. 3A and 3B, according to an exemplary embodiment of the present invention.

FIGS. 4A and 4B are cross-sectional views of a semiconductor substrate respectively taken parallel and perpendicular to a gate extension direction and illustrating thermal condensation performed after selective removal of part of the silicon layers from the silicon and SiGe stack as shown FIG. 3A, according to an exemplary embodiment of the present invention. Referring to FIGS. 4A and 4B, a three-dimensional (3D) thermal condensation is performed on the structure of FIGS. 3A and 3B to result in the structure shown in FIGS. 4A and 4B. During the thermal condensation process, high-Ge content SiGe layers 420 are formed, and the silicon layers 310 are fully consumed by oxidation. The replacement of the silicon layers 310 with the oxide 430 maintains the compressive strain in the resulting SiGe layers 420. In addition to the other areas covered by oxide layer 430 including silicon dioxide ($SiO_2$), the oxide layer 430 is also formed in the areas formerly occupied by the silicon layers 310, and in place of outer lateral side portions (see FIG. 4A) of each of the remaining SiGe layers 420 to form the SiGe layers 420 each having a slightly reduced width along an extension direction of a gate structure. As a result, the thermal condensation process thereby condenses the SiGe layers 220 from lateral side portions in FIG. 3A into SiGe layers 420, which will be the resulting nanowires. The SiGe layers 420 remain compressively strained as a result of not being suspended and instead oxidizing the silicon layers 310 surrounding the SiGe layers 420.

By way of further explanation, in accordance with an embodiment of the present invention, referring to FIGS. 4A and 4B, silicon atoms in the Si layers 310 and in the outer portions of the SiGe layers 220 bond with oxygen that is available during the condensation process to form the oxide 430 (e.g., Sift). As a result, because preferably silicon bonds with the oxygen and not germanium, the germanium from the oxidized portions of the SiGe 220 is driven deeper by diffusion into the remaining portions of the SiGe layers that have not been oxidized to result in the condensed SiGe layers 420. In other words, during the thermal condensation process, germanium migrates into the remaining portions of the compressively strained SiGe layers that have not been oxidized. In accordance with an embodiment of the present invention, due to the germanium enrichment from the thermal condensation process, the SiGe layers 420 each have a germanium concentration that is higher than what the germanium concentration was in each of the SiGe layers 220 before the thermal condensation process.

The condensation is the result of thermal oxidation that is performed at a temperature sufficient enough to cause oxidation of the silicon in the SiGe layers 220. In one embodiment of the present invention, the thermal oxidation is performed at a temperature from about 700° C. to about 1300° C. In another embodiment of the present invention, the thermal oxidation is performed at a temperature from about 1000° C. to about 1200° C.

In accordance with an embodiment of the present invention, the thermal oxidation is performed in an oxidizing ambient which includes at least one oxygen-containing gas such as, for example, $O_2$, NO, $N_2O$, ozone, air and other like oxygen-containing gases. The oxygen-containing gases may be admixed with each other (such as an admixture of $O_2$ and NO), or the gas may be diluted with an inert gas such as, for example, He, Ar, $N_2$, Xe, Kr, or Ne.

In accordance with an embodiment of the present invention, the thermal oxidation may be carried out for a variable period of time. In one example, the thermal oxidation is carried out for a time period from about 5 seconds to about 5 hours, depending on thermal oxidation temperature and oxidation species. In another embodiment, the thermal oxidation may be carried out for a time period from about 5 minutes to about 30 minutes. The thermal oxidation may be carried out at a single targeted temperature, or various ramp and soak cycles using various ramp rates and soak times can be employed.

According to an embodiment, the thermal condensation process is performed until the silicon layers 310 are fully consumed and the resulting SiGe layers 420 having a desired width and germanium concentration are formed. Even after the silicon layers 310 are fully consumed, the resulting SiGe layers 420 are compressively strained because they were not suspended at any point in time during the process.

Figure 5A:
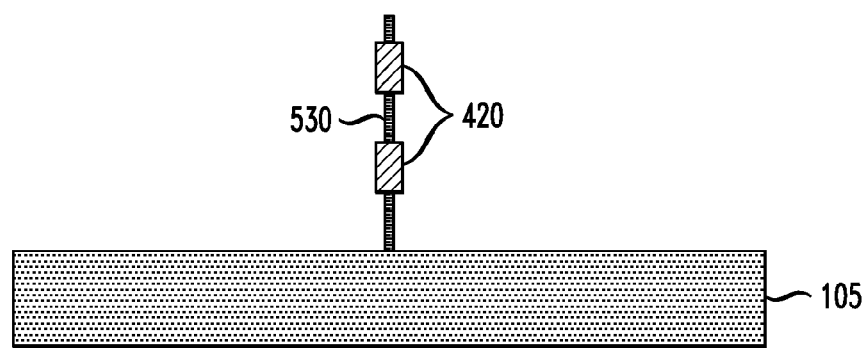
FIG. 5A is a cross-sectional view of a semiconductor substrate taken parallel to a gate extension direction and illustrating removal of part of the oxide layer shown in FIGS. 4A and 4B, according to an exemplary embodiment of the present invention.
Figure 5B:
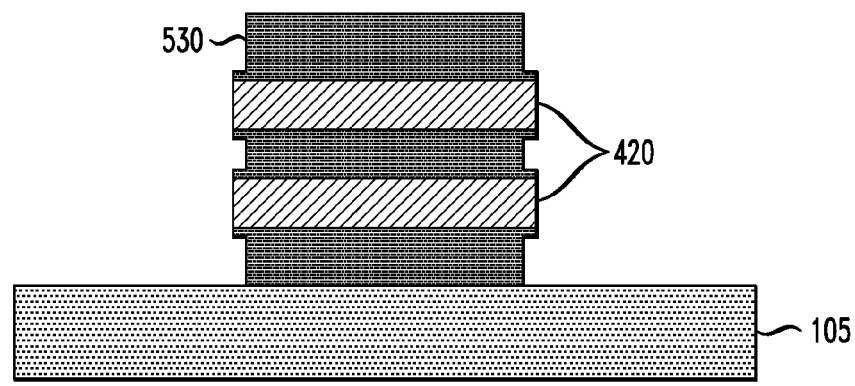
FIG. 5B is a cross-sectional view of a semiconductor substrate taken perpendicular to a gate extension direction and illustrating removal of part of the oxide layer shown in FIGS. 4A and 4B, according to an exemplary embodiment of the present invention.

FIGS. 5A and 5B are cross-sectional views of a semiconductor substrate respectively taken parallel and perpendicular to a gate extension direction and illustrating removal of part of the oxide layer shown in FIGS. 4A and 4B, according to an exemplary embodiment of the present invention. Referring to FIGS. 5A and 5B, portions of the oxide layer 430 are removed, by, for example, an RIE process, to result in patterned oxide layer 530. As can be seen in FIG. 5A, the oxide layer 430 is removed from the substrate 105, and from side portions and part of top and bottom portions of the SiGe layers 420 to result in relatively thin oxide layers 530, which are the resulting anchor structures for the SiGe layers 420. These oxide layers 530 are anchor structures, which are needed to maintain the compressive strain of the SiGe layers 420. The anchor structures prevent the SiGe layers 420 from being suspended, therefore maintaining the previously held compressive strain. As noted above, the SiGe layers 420 become the resulting nanowires. Referring to FIG. 5B, the oxide layer 430 is also removed from lateral ends of the SiGe layers 420, and lengths of the oxide layer 430 are reduced along the left and right direction in FIG. 5B to result in oxide layer 530. According to an embodiment, the RIE process can be performed until the oxide layer 530 having a desired width is formed. Alternatively, a vertical RIE process can be performed to make the $SiO_2$ and SiGe sidewalls coplanar, and then another process, such as, for example, a wet etch process, can be performed to recess the $SiO_2$ until the oxide layer 530 having a desired width is formed. The RIE processes are performed using, for example, fluorocarbon chemistry using $CF_4$, $CHF_3$ or a combination thereof. Other processes for removing the portions of oxide layer 430 can include, for example, dilute hydrofluoric acid etch.

Figure 6A:
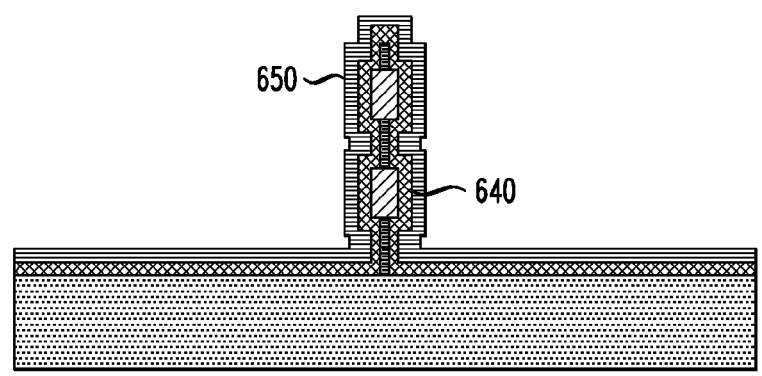
FIG. 6A is a cross-sectional view of a semiconductor substrate taken parallel to a gate extension direction and illustrating deposition of the gate structure, including a dielectric and a metal, performed in a process after formation of the structure of FIGS. 5A and 5B, according to an exemplary embodiment of the present invention.
Figure 6B:
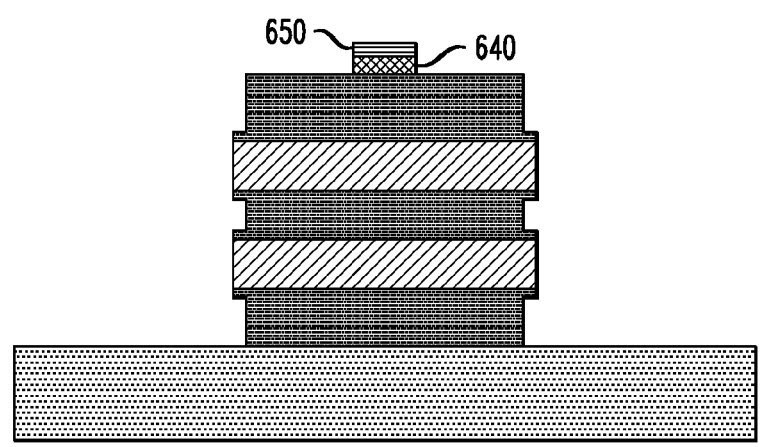
FIG. 6B is a cross-sectional view of a semiconductor substrate taken perpendicular to a gate extension direction and illustrating deposition of the gate structure, including a dielectric and a metal, performed in a process after formation of the structure of FIGS. 5A and 5B, according to an exemplary embodiment of the present invention.

FIGS. 6A and 6B are cross-sectional views of a semiconductor substrate respectively taken parallel and perpendicular to a gate extension direction and illustrating deposition of the gate structure, including a dielectric and a metal, performed in a process after formation of the structure of FIGS. 5A and 5B, according to an exemplary embodiment of the present invention. A metal gate structure includes, for example, low resistance metal 650, such as, for example, tungsten, zirconium, tantalum, titanium, aluminum, ruthenium, metal carbides, metal nitrides, transition metal aluminides, tantalum carbide, titanium carbide, tantalum magnesium carbide, or combinations thereof, and high-K dielectric 640 such as, for example, $HfO_2$ (hathium oxide). The metal gate structure may be formed using, for example, deposition techniques including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD), sputtering, and/or plating. The resulting gate structure is planarized using, for example, chemical mechanical planarization (CMP).

Figure 7:
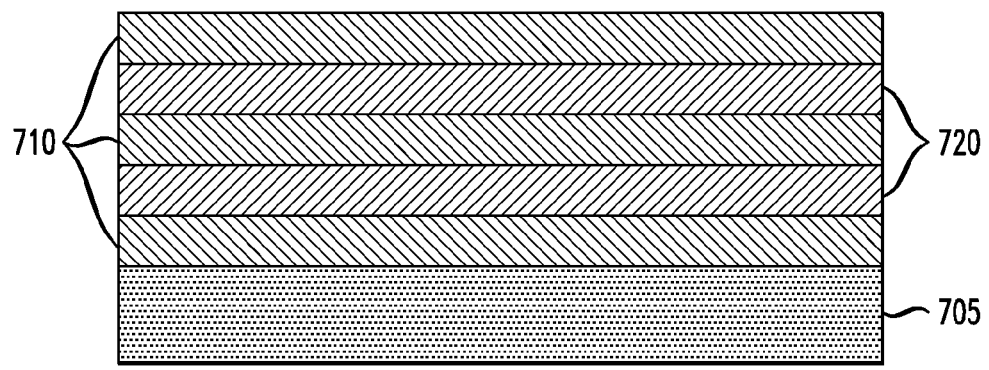
FIG. 7 is a cross-sectional view of a semiconductor substrate taken parallel to a gate extension direction and illustrating epitaxial growth of a relaxed silicon and compressively strained SiGe stack, according to an exemplary embodiment of the present invention.

FIG. 7 is a cross-sectional view of a semiconductor substrate taken parallel to a gate extension direction and illustrating epitaxial growth of a relaxed silicon and compressively strained SiGe stack, according to an exemplary embodiment of the present invention. In accordance with an embodiment of the present invention, as can be seen in FIG. 7, silicon layers 710 and compressively strained SiGe layers 720 are epitaxially grown in an alternating and stacked configuration on a substrate 705, so that a first silicon layer 710 is followed a first SiGe layer 720 on the first silicon layer, which is followed by a second silicon layer 710 on the first SiGe layer 720, and so on. While three silicon layers 710 and two compressively strained SiGe layers 720 are shown, the embodiments of the present invention are not necessarily limited to the shown number of layers 710, 720, and there may be more or less layers in the same alternating configuration depending on design constraints. Additional descriptions used in connection with FIGS. 1A and 1B are equally applicable to FIG. 7, and, for the sake of brevity, are not repeated herein.

Figure 8:
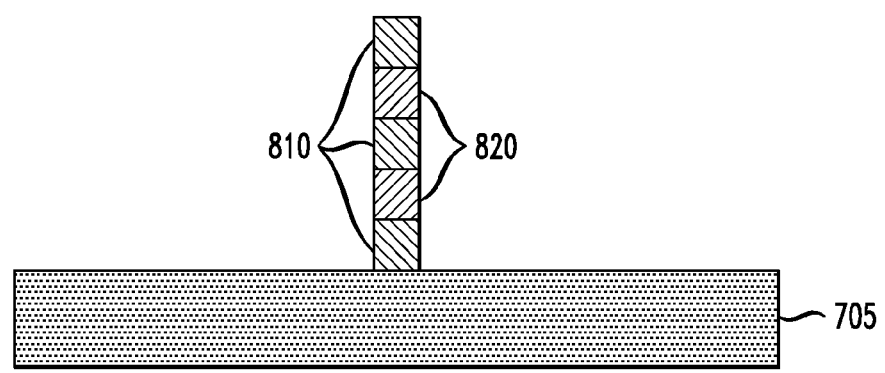
FIG. 8 is a cross-sectional view of a semiconductor substrate taken parallel to a gate extension direction and illustrating patterning of the relaxed silicon and compressively strained SiGe stack, according to an exemplary embodiment of the present invention.

FIG. 8 is a cross-sectional view of a semiconductor substrate taken parallel to a gate extension direction and illustrating patterning of the silicon and compressively strained SiGe stack, according to an exemplary embodiment of the present invention. Like what is discussed in connection with FIGS. 2A and 2B, the patterning decreases a width of the silicon and SiGe layers 710 and 720 along an extension direction of a gate structure, and maintains a length along a channel length direction to result in patterned silicon and SiGe layers 810 and 820. The resulting width of the silicon layers 810 and compressively strained SiGe layers 820 is about 4 nm to about 10 nm. Additional descriptions used in connection with FIGS. 2A and 2B are equally applicable to FIG. 8, and, for the sake of brevity, are not repeated herein.

Figure 9:
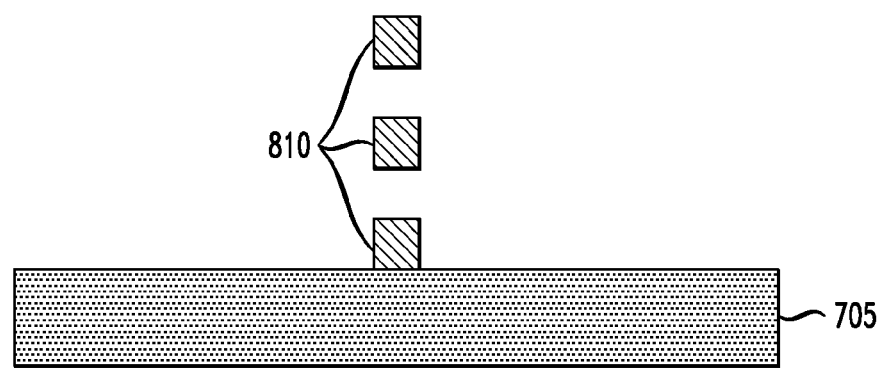
FIG. 9 is a cross-sectional view of a semiconductor substrate taken parallel to a gate extension direction and illustrating selective removal of the compressively strained SiGe layers from the relaxed silicon and compressively strained SiGe stack, according to an exemplary embodiment of the present invention.

FIG. 9 is a cross-sectional view of a semiconductor substrate taken parallel to a gate extension direction and illustrating selective removal of the compressively strained SiGe layers from the silicon and compressively strained SiGe stack, according to an exemplary embodiment of the present invention. Referring to FIG. 9, the compressively strained SiGe layers 820 are selectively removed with respect to the relaxed silicon layers 810. In the case of an NFET device, since there is not a need to maintain compressive strain for an NFET device, the relaxed silicon layers 810 remaining after the complete removal of the SiGe layers 820 is satisfactory.

In accordance with an embodiment of the present invention, the removal of the SiGe layers 820 is performed by etching, such as a wet etch, using, for example, a mixture of hydrogen peroxide, hydrofluoric acid and acetic acid, or using an isotropic dry etch with $CF_4$ gas at high pressure in a plasma system.

It is to be understood that elements shown in a stacked configuration, such as, for example, silicon and SiGe layers, are supported in some manner by elements not shown in the figures. For example, with respect to FIG. 9, although silicon layers 810 are illustrated as suspended or floating in a cross-section with no apparent support, one of ordinary skill in the art will understand that support is provided for these elements in positions that would be in front of and in back of the page in the view of FIG. 9.

Figure 10A:
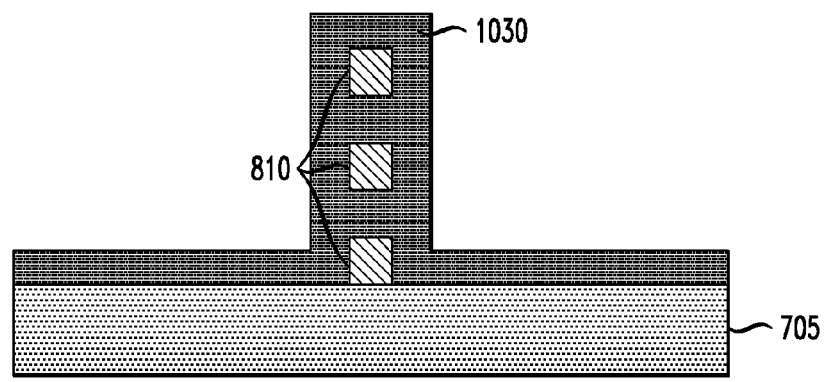
FIG. 10A is a cross-sectional view of a semiconductor substrate taken parallel to a gate extension direction and illustrating oxide deposition performed in a process after selective removal of the compressively strained SiGe layers from the relaxed silicon and compressively strained SiGe stack as shown FIG. 9, according to an exemplary embodiment of the present invention.
Figure 10B:
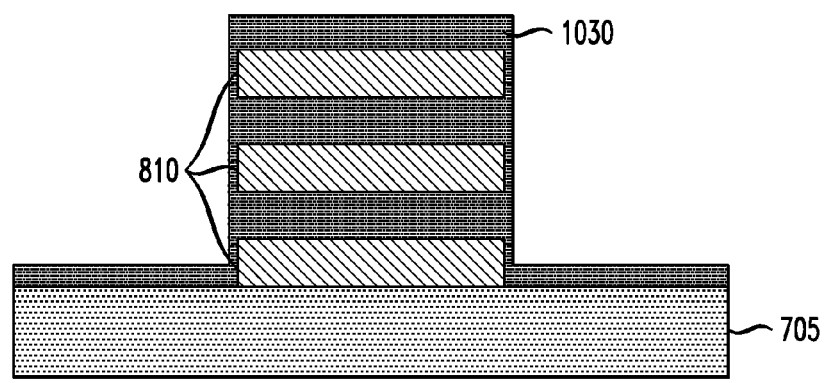
FIG. 10B is a cross-sectional view of a semiconductor substrate taken perpendicular to a gate extension direction and illustrating oxide deposition performed in a process after selective removal of the compressively strained SiGe layers from the relaxed silicon and compressively strained SiGe stack as shown FIG. 9, according to an exemplary embodiment of the present invention.

FIGS. 10A and 10B are cross-sectional views of a semiconductor substrate respectively taken parallel and perpendicular to a gate extension direction and illustrating oxide deposition performed in a process after selective removal of the SiGe layers from the silicon and SiGe stack as shown FIG. 9, according to an exemplary embodiment of the present invention. Referring to FIGS. 10A and 10B, an oxide layer 1030 such as, for example, $SiO_2$, is formed on the substrate 705 and the silicon layers 810. The oxide deposition process is performed by PECVD or LPCVD of an oxide, for example.

Figure 11A:
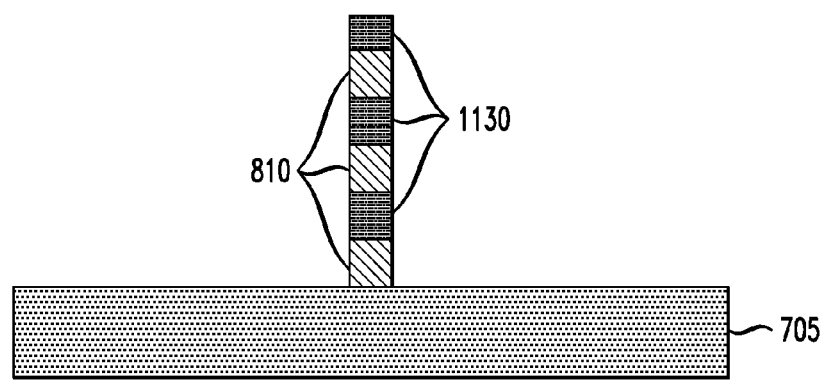
FIG. 11A is a cross-sectional view of a semiconductor substrate taken parallel to a gate extension direction and illustrating removal of part of the oxide layer shown in FIG. 11, according to an exemplary embodiment of the present invention.
Figure 11B:
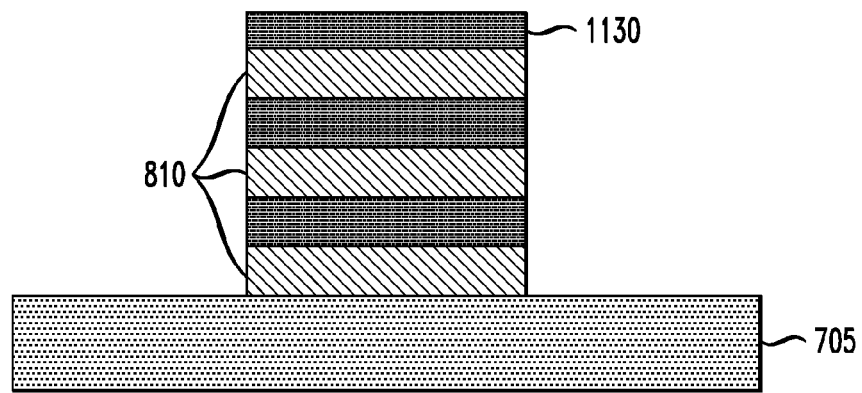
FIG. 11B is a cross-sectional view of a semiconductor substrate taken perpendicular to a gate extension direction and illustrating removal of part of the oxide layer shown in FIG. 11, according to an exemplary embodiment of the present invention.

FIGS. 11A and 11B are cross-sectional views of a semiconductor substrate respectively taken parallel and perpendicular to a gate extension direction and illustrating removal of part of the oxide layer shown in FIG. 11, according to an exemplary embodiment of the present invention. Referring to FIGS. 11A and 11B, portions of the oxide layer 1030 are removed, by, for example, a vertical etch process, to result in patterned oxide layer 1130. As can be seen in FIG. 11A, the oxide layer 1030 is removed from the substrate 705, and from side portions of the silicon layers 810 to result in patterned oxide layers 1130. Referring to FIG. 11B, the oxide layer 1030 is also removed from lateral ends of the silicon layers 810, and lengths of the oxide layer 1030 are reduced along the left and right direction in FIG. 10B to result in oxide layer 1130. The vertical etch process is performed using, for example, fluorocarbon chemistry using CF$_4$, CHF$_3$ or a combination thereof. Other processes for removing the portions of oxide layer 1030 can include, for example, dilute hydrofluoric acid etch.

Figure 12:
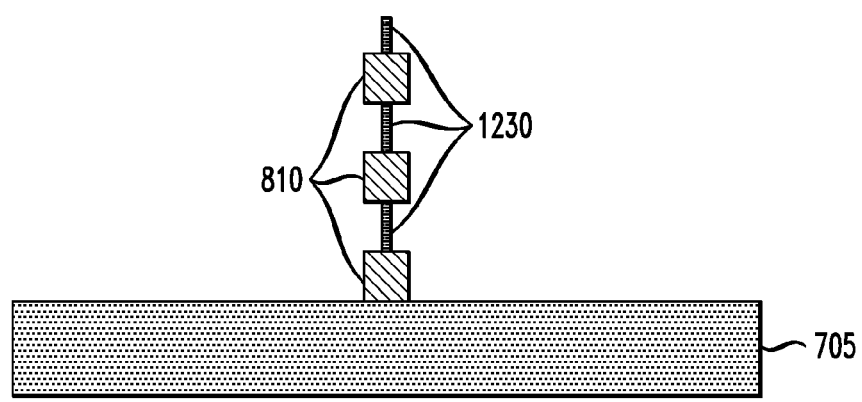
FIG. 12 is a cross-sectional view of a semiconductor substrate taken parallel to a gate extension direction and illustrating removal of part of the oxide layer shown in FIG. 12, according to an exemplary embodiment of the present invention.

FIG. 12 is a cross-sectional view of a semiconductor substrate taken parallel to a gate extension direction and illustrating removal of part of the oxide layer shown in FIGS. 11A and 11B, according to an exemplary embodiment of the present invention. Referring to FIG. 12, portions of the oxide layer 1130 are removed, by, for example, a lateral etch process, to result in patterned oxide layer 1230. As can be seen in FIG. 12, the oxide layer 1130 is recessed horizontally from part of top and bottom portions of the silicon layers 810 to result in relatively thin oxide layers 1230, which are the resulting anchor structures for the silicon layers 810. The silicon layers 810 become the resulting nanowires. The lateral etch process is performed using, for example, dilute hydrofluoric acid.

Figure 13:
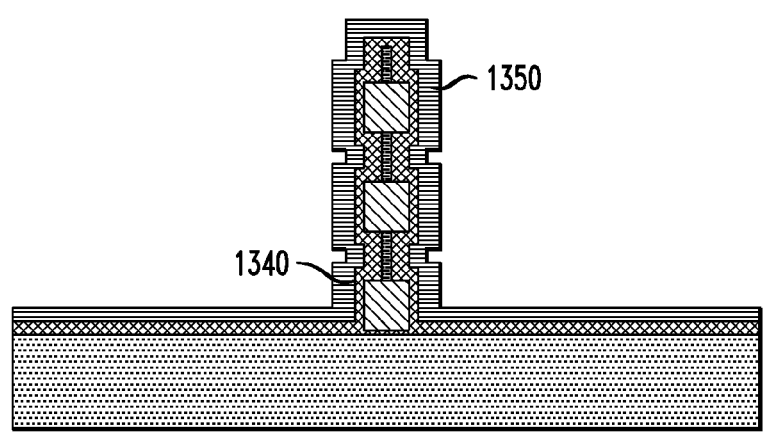
FIG. 13 is a cross-sectional view of a semiconductor substrate taken parallel to a gate extension direction and illustrating deposition of the gate structure, including a dielectric and a metal, performed in a process after formation of the structure of FIG. 12, according to an exemplary embodiment of the present invention.

FIG. 13 is a cross-sectional view of a semiconductor substrate taken parallel to a gate extension direction and illustrating deposition of the gate structure, including a dielectric and a metal, performed in a process after formation of the structure of FIG. 12, according to an exemplary embodiment of the present invention. A metal gate structure includes, for example, low resistance metal 1350, such as, for example, tungsten, zirconium, tantalum, titanium, aluminum, ruthenium, metal carbides, metal nitrides, transition metal aluminides, tantalum carbide, titanium carbide, tantalum magnesium carbide, or combinations thereof, and high-K dielectric 1340 such as, for example, HfO$_2$ (hathium oxide). The metal gate structure may be formed using, for example, the same deposition techniques mentioned in connection with FIGS. 6A and 6B. The resulting gate structure is planarized using, for example, CMP.

In accordance with an embodiment, after deposition of the gate structures in FIGS. 6A, 6B and 13, source/drain epitaxy can be performed with proper doping to result in PFET and NFET devices.

In accordance with the embodiments of the present invention, in connection with the manufacture of PFET devices, any compressive strain of the resulting SiGe layers 420 due to, for example, mismatched lattice structures between SiGe and silicon, is maintained because anchor layers above and below the SiGe layers during processing are not removed. As a result, the SiGe layers 420, which become the nanowires, are not relaxed and are maintained in a compressively strained state. Strain energy (e.g., compressive strain) maintains local equilibrium between mismatched lattice structures of two materials (e.g., silicon layer and SiGe on the silicon layer). A relaxed state, for example, in the silicon layers of a stacked configuration, refers to a state without compressive or tensile strain.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   epitaxially growing a plurality of silicon layers and a plurality of compressively strained silicon germanium (SiGe) layers on a substrate in a stacked configuration, wherein the plurality of silicon layers and the plurality of compressively strained SiGe layers are alternately stacked on each other starting with a silicon layer on a bottom of the stacked configuration, wherein a compressive strain in each of the plurality of compressively strained SiGe layers is maintained by the plurality of silicon layers contacting the plurality of compressively strained SiGe layers, and wherein the plurality of compressively strained SiGe layers form channel regions of the semiconductor device;
   patterning the stacked configuration to a first width;
   selectively removing a portion of each of the plurality of silicon layers in the stacked configuration to reduce each of the plurality of silicon layers to a second width less than the first width;
   performing a condensation process after the selective removal of the portion of each of the plurality of silicon layers from the stacked configuration, wherein the plurality of silicon layers reduced by the selective removal are fully oxidized during the condensation process, and the condensation process results in an oxide layer on the substrate and on remaining portions of the stacked configuration, the oxide layer including fully oxidized silicon portions formed in place of each silicon layer, wherein a compressive strain in each of the plurality of compressively strained SiGe layers is maintained by the fully oxidized silicon portions contacting the plurality of compressively strained SiGe layers;
   removing the oxide layer from side portions of the plurality of compressively strained SiGe layers; and
   removing part of the oxide layer from top and bottom portions of the plurality of compressively strained SiGe layers, wherein remaining portions of the oxide layer on the top and bottom portions of the plurality of compressively strained SiGe layers are in the stacked configuration and have a smaller width than a width of the plurality of compressively strained SiGe layers, the remaining portions of the oxide layer not being removed from the stacked configuration, thereby maintaining the compressive strain in each of the plurality of compressively strained SiGe layers.

2. The method of claim 1, wherein the first width is about 4 nm to about 10 nm.

3. The method of claim 1, wherein the patterning comprises reactive ion etching.

4. The method of claim 1, wherein the second width is about 2 nm to about 4 nm.

5. The method of claim 1, wherein the selective removal of the portion of each of the plurality of silicon layers is performed without reducing a size of the plurality of compressively strained SiGe layers in the stacked configuration.

6. The method of claim 1, further comprising, after the removing of part of the oxide layer:
   depositing a dielectric layer on the stacked configuration; and
   depositing a metal layer on the dielectric layer.

7. The method of claim 1, wherein the condensation process increases a concentration of germanium in the plurality of compressively strained SiGe layers of the stacked configuration.

8. The method of claim 1, wherein the plurality of silicon layers in the stacked configuration are relaxed.

9. The method of claim 1, wherein the condensation process is a thermal condensation process.

10. The method of claim 1, wherein the removing of part of the oxide layer comprises one or more reactive ion etch processes.

11. A method for manufacturing a semiconductor device, comprising:
    epitaxially growing a plurality of silicon layers and a plurality of compressively strained silicon germanium (SiGe) layers on a substrate in a stacked configuration, wherein the plurality of silicon layers and the plurality of compressively strained SiGe layers are alternately stacked on each other starting with a silicon layer on a bottom of the stacked configuration, wherein a compressive strain in each of the plurality of compressively strained SiGe layers is maintained by the plurality of silicon layers contacting the plurality of compressively strained SiGe layers, and wherein the plurality of compressively strained SiGe layers form channel regions of the semiconductor device;

patterning the stacked configuration to a first width;

selectively removing a portion of each of the plurality of silicon layers in the stacked configuration to reduce each of the plurality of silicon layers to a second width less than the first width;

forming an oxide layer on the plurality of compressively strained SiGe layers of the stacked configuration, wherein forming the oxide layer comprises fully oxidizing remaining portions of the plurality of silicon layers after the selective removal of the portion of each of the plurality of silicon layers from the stacked configuration so that fully oxidized silicon portions of the oxide layer are formed in place of each silicon layer;

removing the oxide layer from side portions of the plurality of compressively strained SiGe layers; and removing part of the oxide layer from top and bottom portions of the plurality of compressively strained SiGe layers, while maintaining at least part of the fully oxidized silicon portions of the oxide layer formed in place of each silicon layer on the top and bottom portions of the plurality of compressively strained SiGe layers, wherein the plurality of compressively strained SiGe layers are anchored to one another and a compressive strain is maintained in each of the plurality of compressively strained SiGe layers by the fully oxidized silicon portions contacting the plurality of compressively strained SiGe layers on the top and bottom portions of the plurality of compressively strained SiGe layers.

12. The method of claim 11, wherein the second width is about 2 nm to about 4 nm.

13. The method of claim 11, wherein the selective removal of the portion of each of the plurality of silicon layers is performed without reducing a size of the plurality of compressively strained SiGe layers in the stacked configuration.

14. The method of claim 11, wherein the plurality of silicon layers in the stacked configuration are relaxed.

15. The method of claim 11, wherein the fully oxidizing is performed via a thermal condensation process that also increases a concentration of germanium in the plurality of compressively strained SiGe layers of the stacked configuration.

* * * * *